(12) United States Patent
Chen et al.

(10) Patent No.: US 12,205,905 B2
(45) Date of Patent: Jan. 21, 2025

(54) SEMICONDUCTOR STRUCTURE

(71) Applicant: UNITED MICROELECTRONICS CORP., Hsin-Chu (TW)

(72) Inventors: Yen-Hsing Chen, Taipei (TW); Yu-Ming Hsu, Changhua County (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 80 days.

(21) Appl. No.: 17/179,422

(22) Filed: Feb. 19, 2021

(65) Prior Publication Data
US 2022/0208694 A1    Jun. 30, 2022

(30) Foreign Application Priority Data
Dec. 31, 2020 (CN) .......................... 202011620433.9

(51) Int. Cl.
*H01L 23/00* (2006.01)
*H01L 29/20* (2006.01)

(52) U.S. Cl.
CPC ........ *H01L 23/562* (2013.01); *H01L 29/2003* (2013.01)

(58) Field of Classification Search
CPC ............... H01L 23/562; H01L 29/2003; H01L 21/0243; H01L 21/02521; H01L 21/02639; H01L 21/78; H01L 21/02002; H01L 29/04
See application file for complete search history.

(56) References Cited

U.S. PATENT DOCUMENTS

| | | |
|---|---|---|
| 8,524,608 B1 | 9/2013 | Kuo |
| 8,647,991 B1 | 2/2014 | Liu |
| 8,778,604 B2 | 7/2014 | Kuo |
| 9,024,416 B2 | 5/2015 | Chen |
| 10,340,231 B2 | 7/2019 | Chen |
| 10,985,271 B2 | 4/2021 | Yang |
| 11,081,579 B2 | 8/2021 | Chang |
| 11,239,327 B2 | 2/2022 | Lee |
| 11,264,492 B2 | 3/2022 | Huang |
| 11,296,214 B2 | 4/2022 | Lee |
| 2010/0028605 A1* | 2/2010 | Oshima ............. H01L 21/02658 428/156 |
| 2013/0087807 A1 | 4/2013 | Ikuta |
| 2016/0247967 A1* | 8/2016 | Ward .................... H01L 33/007 |
| 2017/0263440 A1* | 9/2017 | Schulze ............. H01L 21/0243 |
| 2019/0043757 A1 | 2/2019 | Zechmann |

FOREIGN PATENT DOCUMENTS

JP 201493369 * 5/2014 ........... H01L 33/007

* cited by examiner

*Primary Examiner* — Jay C Kim
*Assistant Examiner* — Woo K Lee
(74) *Attorney, Agent, or Firm* — Winston Hsu

(57) ABSTRACT

A semiconductor structure includes a substrate including a device region, a peripheral region surrounding the device region, and a transition region disposed between the device region and the peripheral region. An epitaxial layer is disposed on the device region, the peripheral region, and the transition region. A first portion of the epitaxial layer on the peripheral region has a poly-crystal structure.

13 Claims, 13 Drawing Sheets

SEMICONDUCTOR STRUCTURE

BACKGROUND OF THE INVENTION

1. Field of the Invention

The present invention relates to the field of semiconductor technology. More particularly, the present invention relates a semiconductor structure with a heteroepitaxial layer.

2. Description of the Prior Art

In the field of semiconductor technology, in order to meet the needs of higher frequencies and lower power consumption, compound semiconductor devices have gradually replaced conventional silicon-based semiconductor devices, and have been widely used in the mainstream semiconductor applications such as power converters, low noise amplifiers, radio frequency (RF) or millimeter wave (MMW) devices.

Compound semiconductor devices are usually fabricated on a heteroepitaxial substrate. However, the current manufacturing process still encounters some challenges. For example, the lattice mismatch or the thermal expansion mismatch of the materials of the heteroepitaxial structure may cause accumulated stress or dislocation defects to be formed in the heteroepitaxial structure. In some cases, an excessive stress accumulated in the heteroepitaxial structure when a process shit occurs may cause cracking and adversely influence the product yield.

SUMMARY OF THE INVENTION

In light of the above, the present invention is directed to provide a semiconductor structure having an amorphous layer or a trench formed in a pre-determined region of a substrate, which allows a portion of the epitaxial layer grown on the amorphous layer or the trench to have a poly-crystal structure. The poly-crystal portion of the epitaxial layer may absorb or release the stress caused by lattice mismatch or thermal expansion mismatch between the epitaxial layer and the substrate, so that cracks of the substrate or propagation of the dislocation defects in the epitaxial layer may be reduced.

According to an embodiment of the present invention, a semiconductor structure is provided. The semiconductor structure includes a substrate comprising a device region, a peripheral region surrounding the device region, and a transition region between the peripheral region and the device region. The semiconductor structure further includes an epitaxial layer on the device region, the peripheral region and the transition region, wherein a first portion of the epitaxial layer on the transition region comprises a poly-crystal structure.

According to an embodiment of the present invention, a semiconductor structure is provided. The semiconductor structure includes a substrate, comprising a plurality of chip regions, a plurality of transition regions respectively surrounding the chip regions, and a scribe line region between the transition regions. The semiconductor structure further includes an epitaxial layer on the chip regions, the transition regions, and the scribe line region of the substrate, wherein a plurality of fifth portions of the epitaxial layer respectively on one of the transition regions respectively comprise a poly-crystal structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 shows a schematic top plan view of a substrate of the semiconductor structure. FIG. 2 and FIG. 3 are schematic enlarged cross-sectional views of a portion of the substrate along a line E-E' as shown FIG. 1.

FIG. 10 shows a schematic top plan view of a substrate of the semiconductor structure. FIG. 11 and FIG. 12 are schematic enlarged cross-sectional views of a portion of the substrate along a line A-A' as shown FIG. 10.

DETAILED DESCRIPTION

Figure 1:
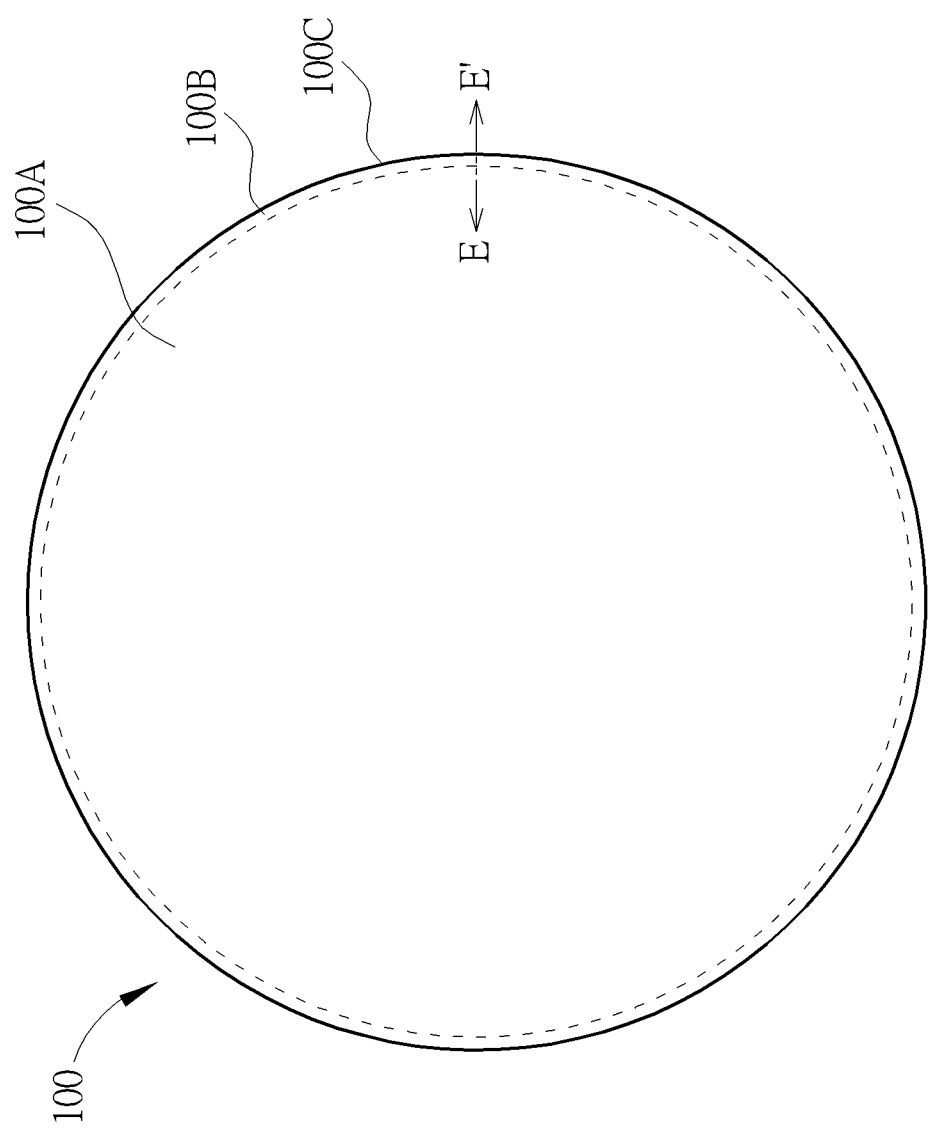
FIG. 1, FIG. 2 and FIG. 3 are schematic diagrams illustrating the steps of a method for forming a semiconductor structure according to one embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

Figure 2:
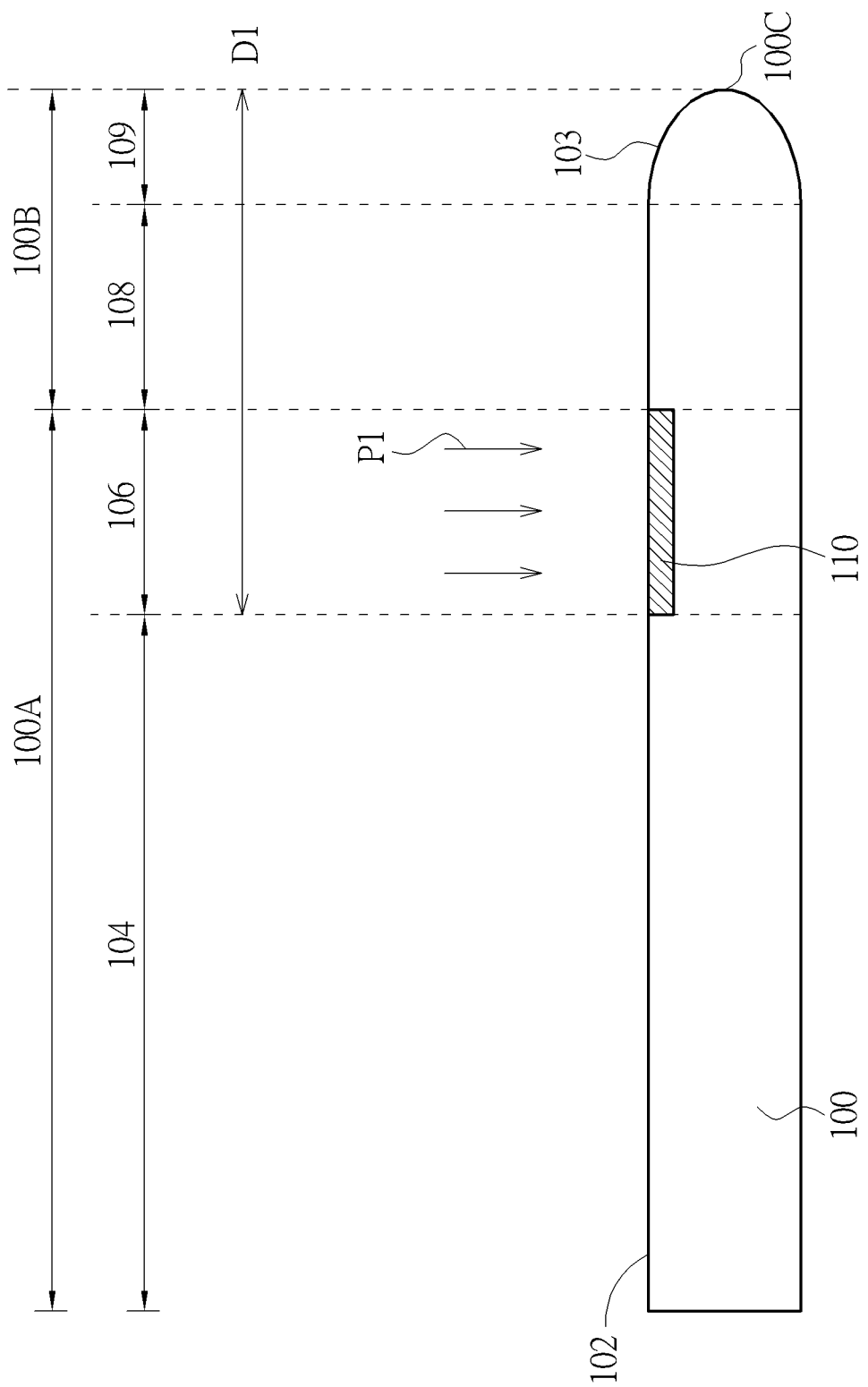
Figure 3:
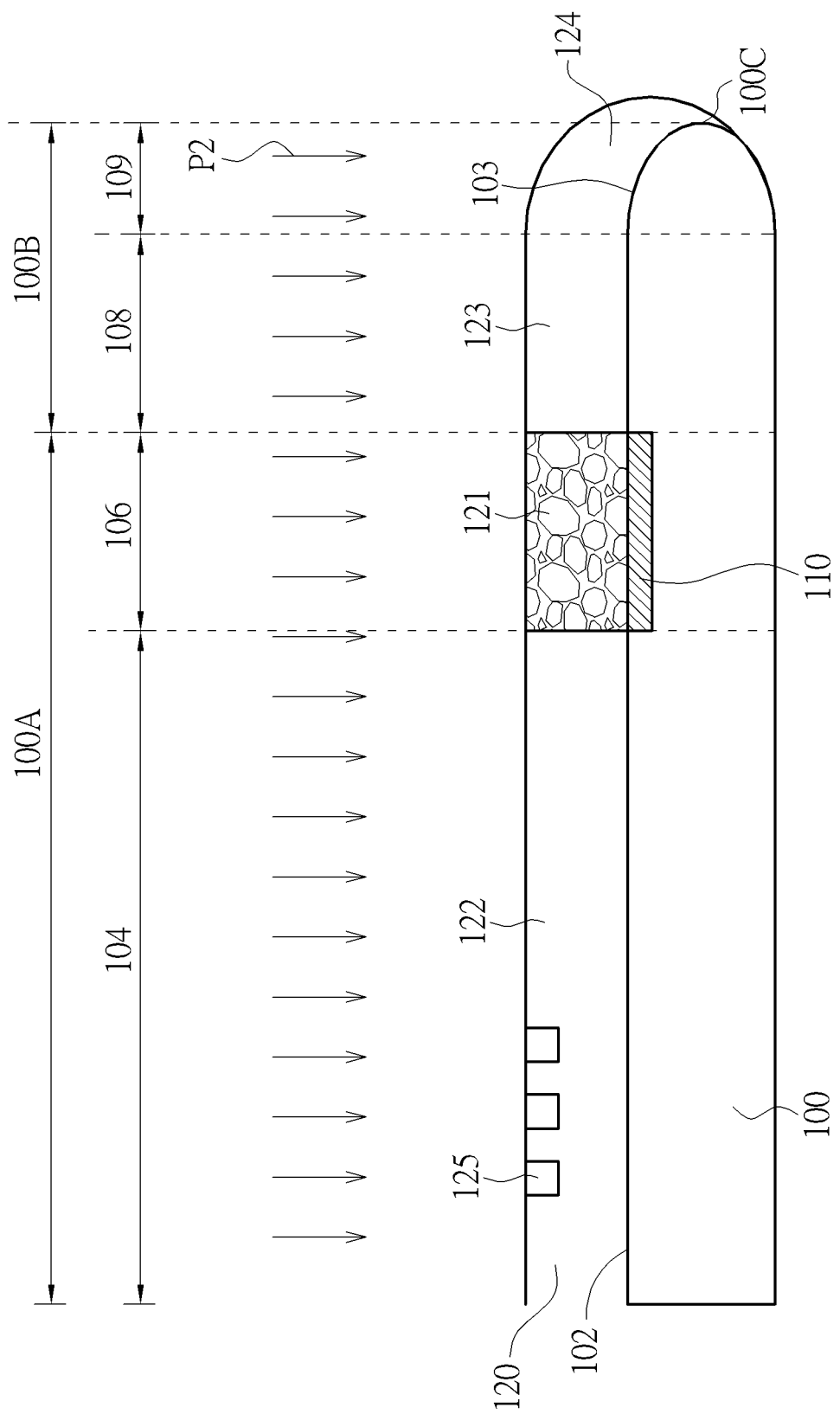

FIG. 1, FIG. 2 and FIG. 3 are schematic diagrams illustrating the steps of a method for forming a semiconductor structure according to one embodiment of the present invention. FIG. 1 shows a schematic top plan view of a substrate of the semiconductor structure. FIG. 2 and FIG. 3 are schematic enlarged cross-sectional views of a portion of the substrate along a line E-E' as shown FIG. 1.

Please refer to FIG. 1. A substrate 100 is provided. The substrate 100 may include a single crystal structure suitable for epitaxial growth. According to an embodiment, the material of the substrate 100 may include silicon (Si), silicon carbide (SiC), aluminum oxide (also called sapphire substrate), gallium arsenide (GaAs), gallium phosphide (GaP), nitrogen, gallium (GaN), or aluminum nitride (AlN), but is not limited thereto. According to an embodiment of the present invention, the substrate 100 may be a single crystal silicon substrate.

According to an embodiment of the present invention, the substrate 100 may be a wafer with a planar region 100A, a wafer edge 100C, and a wafer edge region 100B located between the planar region 100A and the wafer edge 100C and surrounding the planar region 100A, as shown in FIG. 1.

According to an embodiment of the present invention, as shown in FIG. 2, from the center to the edge of the substrate 100, the planar region 100A may include a device region 104 and a transition region 106 surrounding the outer edge of the device region 104. The wafer edge region 100B may include a peripheral region 108 surrounding the outer edge of the transition region 106 of the planar region 100A, and a bevel region 109 between the peripheral region 108 and the wafer edge 100C and surrounding the peripheral region 108. In other words, the transition region 106 is located between the device region 104 and the peripheral region 108. According to an embodiment of the present invention, the substrate 100 has a planar main surface 102, which is a crystal plane of the substrate 100 with a uniform crystal orientation and covers the device region 104 and the transition region 106 of the substrate 100

The device region 104 defines the region where the semiconductor devices such as transistors, bipolars, thyristors, light-emitting devices, capacitors, inductors or other types of semiconductor devices are formed.

The area of the transition region 106 may be adjusted according to process needs. According to an embodiment of the present invention when the substrate 100 is a wafer, and the distance D1 from the boundary between the transition region 106 and the device region 104 to the wafer edge 100C may be between 7% and 10% of the radius of the wafer. For example, in an embodiment when the substrate 100 is a 6-inch wafer, the distance D1 may be between approximately 5 mm and 7.5 mm, but is not limited thereto.

The bevel region 109 of the wafer edge region 100B may be formed by wafer edge treatment process such as cutting or grinding. By control of wafer edge treatment process, the surface 103 of the bevel region 109 may be an inclined surface, a curved surface, a smooth surface, a rough surface, a surface of a crystal plane, or an amorphous surface, but is not limited thereto. According to an embodiment of the present invention, the bevel region 109 may help to reduce wafer cracking caused by stress accumulated at the wafer edge. Furthermore, the bevel region 109 may reduce the photoresist beads at the wafer edge 100C, so that the coating uniformity of the photoresist may be improved.

The peripheral region 108 of the wafer edge region 100B may have a planar surface, an inclined surface, a curved surface, a smooth surface, a rough surface, a surface of a crystal plane, or an amorphous surface, depending on the control of the wafer edge treatment process. According to an embodiment of the present invention, the peripheral region 108 may have a planar surface of the crystal plane the same as the device region 104 and the transition region 106 of the planar region 100A of the substrate 100, and is substantially a portion of the main surface 102 of the substrate 100. In other words, the main surface 102 of the substrate 100 may cover the peripheral region 108 of the wafer edge region 100B.

As shown in FIG. 2. An ion implantation process P1 may be performed on the main surface 102 of the substrate 100 to implant an amorphizing agent into a pre-determined region of the transition region 106 in order to damage the crystal structure of the pre-determined region of the substrate 100, such that an amorphous layer 110 near the main surface 102 of the substrate 100 and having an amorphous surface may be formed in the pre-determined region of the transition region 106 of the substrate 100. According to an embodiment of the present invention, the amorphizing agent may be any substance capable to amorphize the crystal structure of the substrate 100. For example, the amorphizing agent may comprise at least one of argon (Ar), krypton (Kr), neon (Ne), nitrogen (N), arsenic (As), phosphorus (P), boron (B) and germanium (Ge), but is not limited thereto. The thickness of the amorphous layer 110 (or the depth of the bottom surface of the amorphous layer 110 in the substrate 100) may be controlled by the implanting angle and implanting energy of the ion implantation process P1. According to an embodiment of the present invention, the thickness of the amorphous layer 110 may be between 0.1 um and 1 um, but is not limited thereto.

Subsequently, as shown in FIG. 3, an epitaxial growth process P2 may be performed to form an epitaxial layer 120 on the substrate 100 and covering the device region 104, the transition region 106, and the peripheral region 108 in a blanket manner. According to an embodiment of the present invention, the epitaxial layer 120 may further covers the bevel region 109 and the wafer edge 100C of the substrate 100.

According to an embodiment of the present invention, the epitaxial growth process P2 may be a hetero-epitaxial growth process. For example, the epitaxial growth process P2 may be a molecule beam epitaxy (MEB) process, a metal-organic chemical vapor deposition (MOCVD) process, or a hydride vapor phase deposition (HVPE), but is not limited thereto. According to an embodiment of the present invention, the epitaxial layer 120 may include semiconductor materials. For example, the epitaxial layer 120 may include layers of silicon (Si), germanium (Ge), boron (B), silicon carbide (SiC), III-V compound semiconductor materials such as GaAs, GaN, AlGaN, AlInN, InGaN, AlGaInN, doped GaN, AlN, or a combination thereof, but is not limited thereto. According to an embodiment of the present invention, the epitaxial layer 120 may have a multi-layered structure. For example, the epitaxial layer 120 may include at least a GaN layer and at least an AlGaN layer.

Please continue to refer to FIG. 3. To be more detailed, the epitaxial layer 120 may include a first portion 121 on the transition region 106 of the substrate 100, a second portion 122 on the device region 104 of the substrate 100, and a third portion 123 on the peripheral region 108 of the substrate 100. According to an embodiment of the present invention, because that the second portion 122 and the third portion 123 of the epitaxial layer 120 are grown from the crystal surface of the main surface 102, the second portion 122 and the third portion 123 may respectively have a single crystal structure. It is noteworthy that since the first portion 121 of the epitaxial layer 120 is grown from the surface (an amorphous surface) of the amorphous layer 110, the first portion 121 may have a poly-crystal structure.

According to an embodiment of the present invention, the epitaxial layer 120 may further include a fourth portion 124 on the surface 103 of the bevel region 109 and covering the wafer edge 100C. The fourth portion 124 may have a single crystal structure or a poly-crystal structure, depending on the surface condition of the surface 103 (may be an inclined surface, a curved surface, a smooth surface, a rough surface, a surface of a crystal plane, or an amorphous surface, depending on the wafer edge treatment process) of the fourth portion 124.

After forming the epitaxial layer 120, as shown in FIG. 3, subsequent semiconductor manufacturing processes (not shown) such as deposition, lithography, etching, ion implantation, epitaxial growth, thermal growth, and/or other processes may be performed to form a plurality of semiconductor devices 125 in the second portion 122 of the epitaxial layer 120. The semiconductor devices 125 may include transistors, bipolars, thyristors, light-emitting devices, capacitors, inductors, or other semiconductor devices, but are not limited thereto.

It is known in the field that in an heteroepitaxial structure that the epitaxial layer 120 and the substrate 100 have different materials with different lattice coefficients and/or thermal expansion coefficients, stress may be generated in the epitaxial layer 120 and may tend to accumulate in the edge portion (for example, in the third portion 123 or the fourth portion 124) of the epitaxial layer 120 near the edge of the substrate 100. In some serious cases, the excessive stress accumulated in the epitaxial layer 120 may cause wafer cracking, and the cracks may extend inward to the second portion 122 of the epitaxial layer 120 and adversely affect the quality of the semiconductor devices 125.

One feature of the present invention is that, as shown in FIG. 1, FIG. 2 and FIG. 3, by forming the amorphous layer 110 in the transition region 106 between the device region 104 and the peripheral region 108 of the substrate 100, the first portion 121 of the epitaxial layer 120 epitaxially grown on the amorphous layer 110 may have a poly-crystal structure and may release or absorb the stress in the epitaxial layer 120. Furthermore, the first portion 121 of the epitaxial layer 120 may also be used as a barrier structure to prevent the cracks from extending and spreading into the second portion 122 of the epitaxial layer 120. In this way, the quality of the semiconductor devices 125 may be guaranteed.

Figure 4:
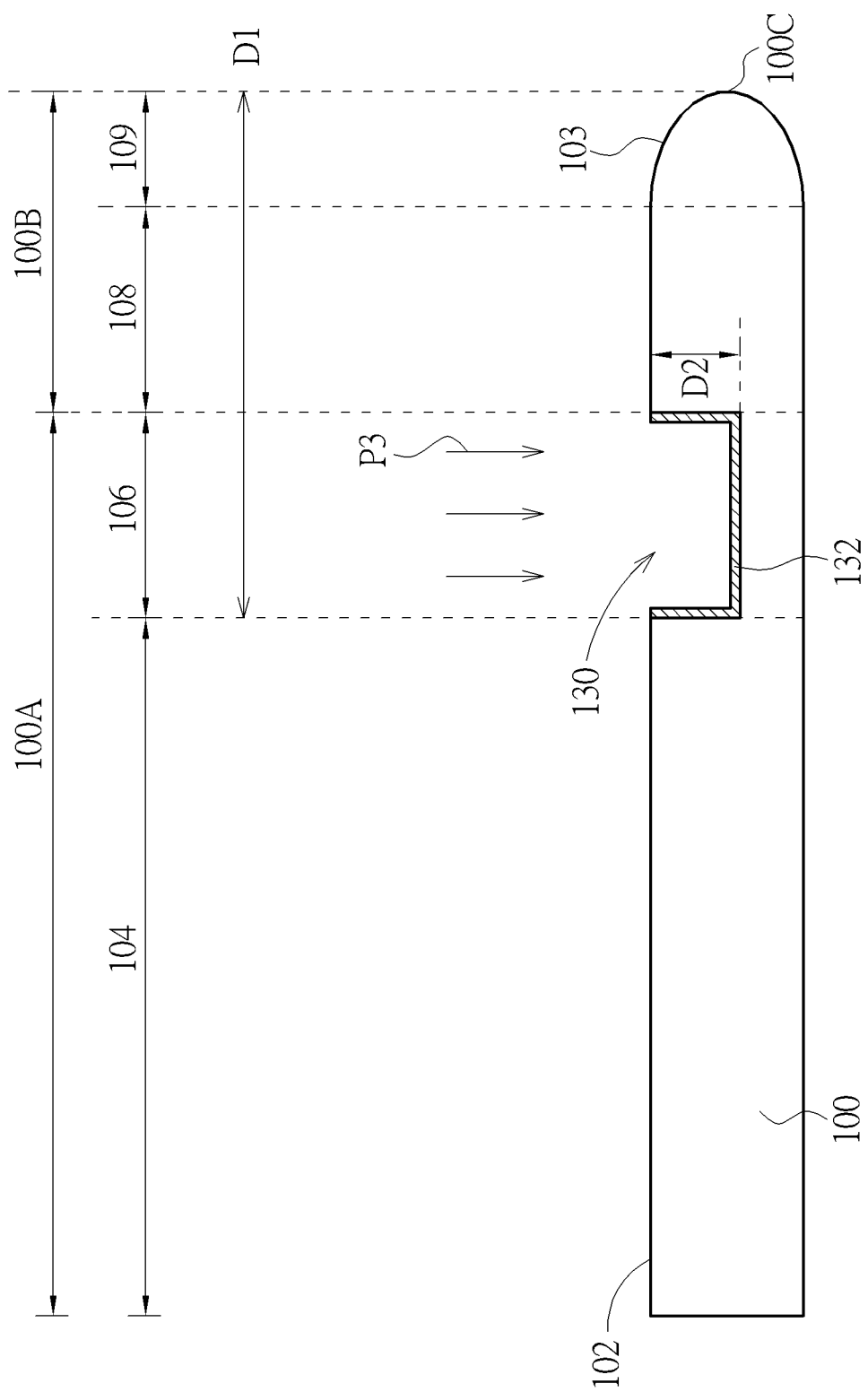
FIG. 4 and FIG. 5 are schematic enlarged cross-sectional views illustrating the steps of a method for forming a semiconductor structure according to another embodiment of the present invention.
Figure 5:
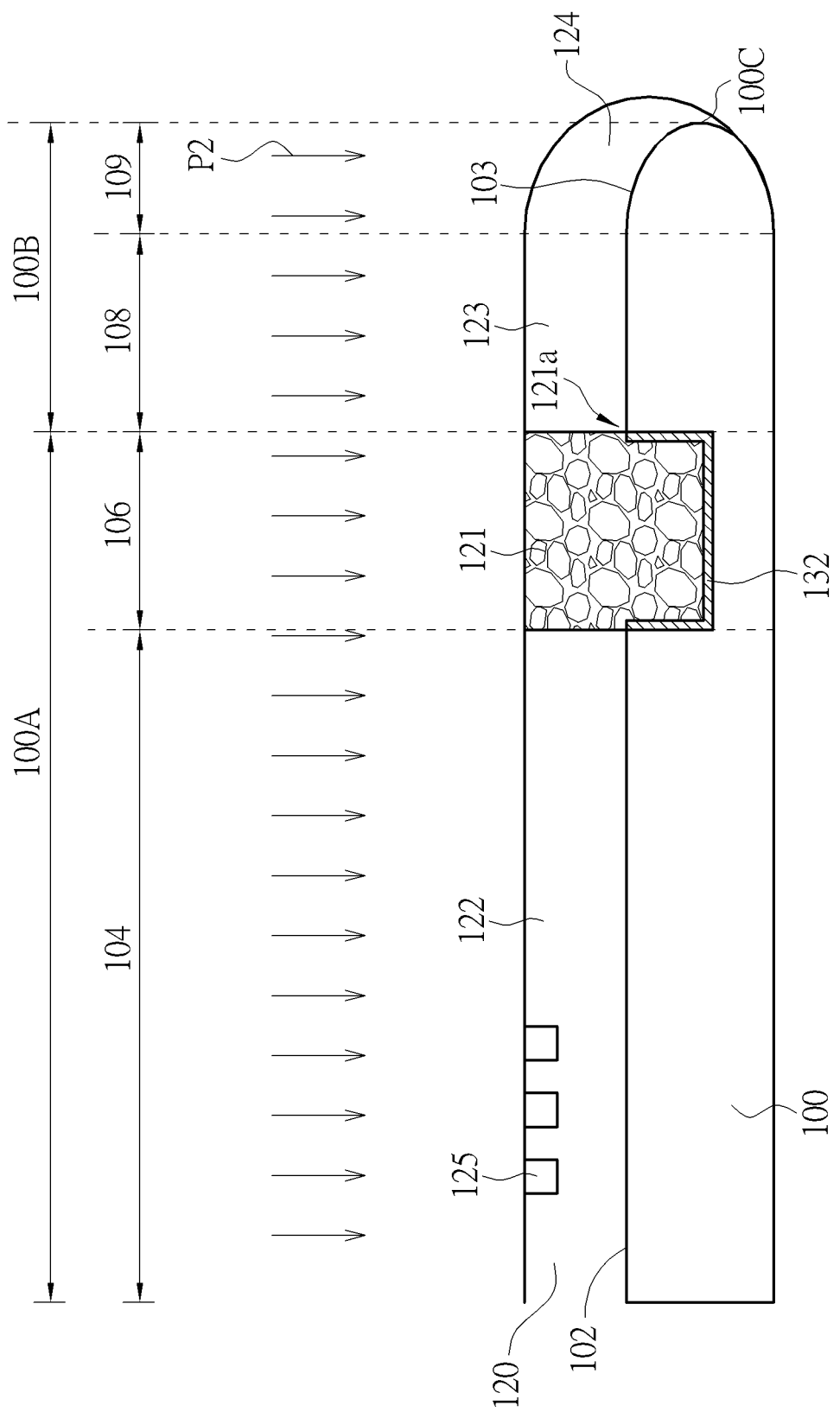

Please refer to FIG. 4 and FIG. 5, which are schematic cross-sectional views illustrating the steps of a method for forming a semiconductor structure according to another embodiment of the present invention. To simplify the description, identical components in the embodiment shown in FIG. 4 and FIG. 5 and the embodiment shown in FIG. 2 and FIG. 3 are marked with identical symbols. The embodiment shown in FIG. 4 and FIG. 5 is different from the embodiment shown in FIG. 2 and FIG. 3 in that, as shown in FIG. 4 and FIG. 5, an etching process P3 may be performed to form a trench 130 in the transition region 106 of the substrate 100. After that, the epitaxial growth process P2 is performed to form the epitaxial layer 120 on the substrate 100 and covering the device region 104, the transition region 106, the peripheral region 108, the bevel region 109 and the wafer edge 100C of the substrate 100 and completely filling the trench 130. According to an embodiment of the present invention, the etching process P3 may be a laser marking process, and the trench 130 may be a laser mark trench. In other embodiments, the etching process P3 may be a dry etching process such as plasma etching process or ion beam etching process or a wet etching process, and the trench 130 may be an etched trench, but is not limited thereto. The trench 130 may have a depth D2 in the substrate, and the depth D2 may be adjusted according to design needs. According to an embodiment of the present invention, the depth D2 may be at least 1 um.

According to an embodiment of the present invention, the lattice structure of the substrate 100 exposed from the sidewalls and the bottom surface of the trench 130 may be destroyed by the etching process P3, so that an amorphous layer 132 may be formed along the sidewalls and the bottom surface of the trench 130. Therefore, the first portion 121 of the epitaxial layer 120 that is grown on the amorphous layer 132 and completely fills the trench 130 may have a poly-crystal structure. The poly-crystal structure of the first portion 121 f the epitaxial layer 120 may help to release the stress in the epitaxial layer 120 and also prevent the extending and spreading of the cracks. According to an embodiment of the present invention, the first portion 121 of the epitaxial layer 120 may have a slightly extended portion 121 that extends laterally to cover the top surface of the amorphous layer 132 near the opening of the trench 130.

FIG. 6, FIG. 7, FIG. 8 and FIG. 9 are schematic top plan views showing some exemplary implementations of the amorphous layer 110 of the embodiment shown in FIG. 2 and FIG. 3 or the trench 130 of the embodiment shown in FIG. 4 and FIG. 5.

Figure 6:
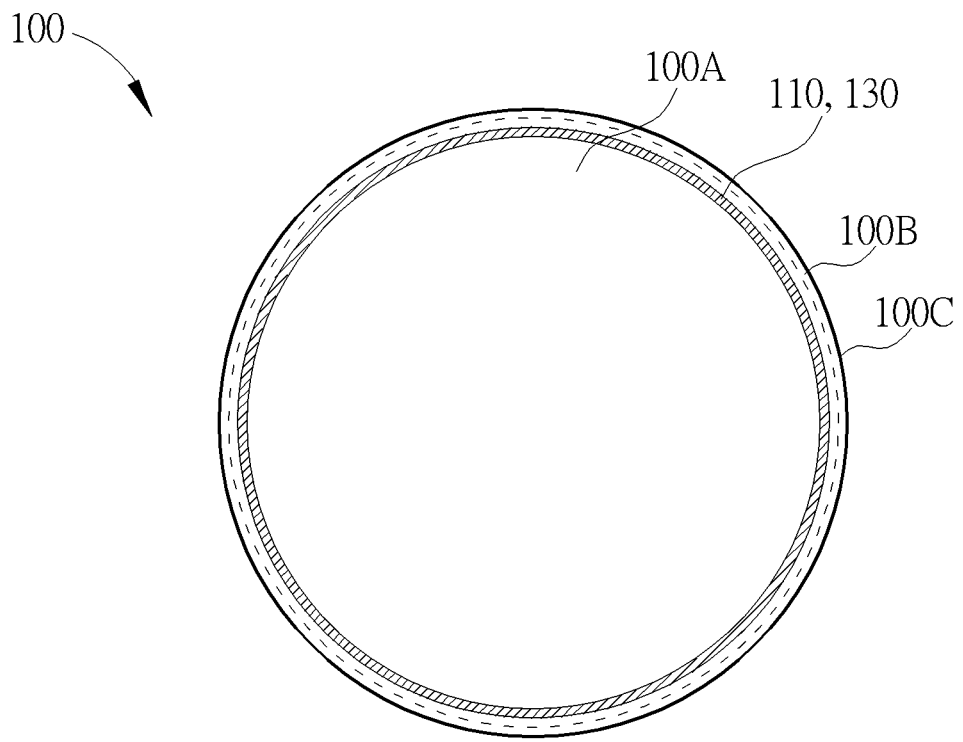
FIG. 6, FIG. 7, FIG. 8 and FIG. 9 are schematic top plan views of the semiconductor structures according to some embodiments of the present invention.
Figure 7:
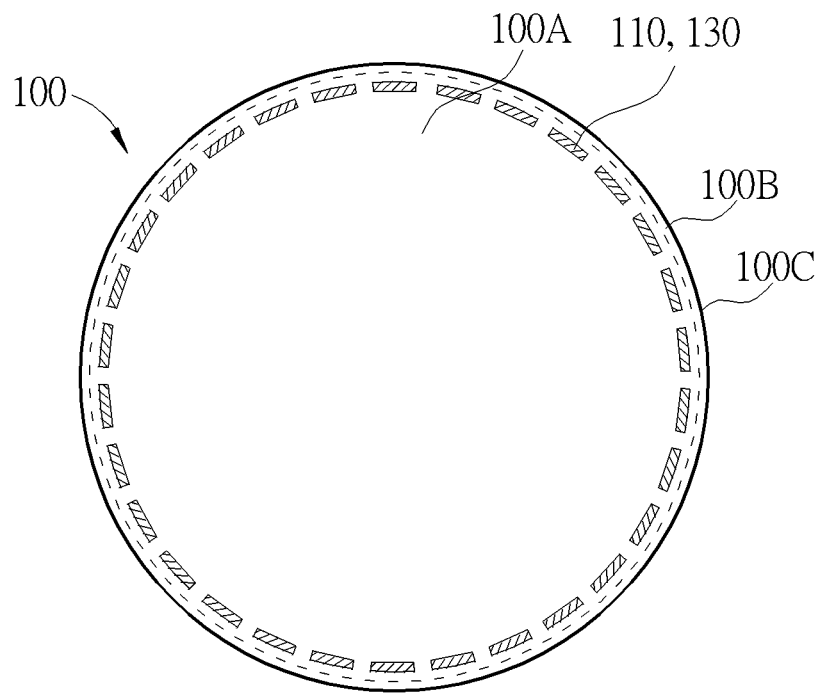
Figure 8:
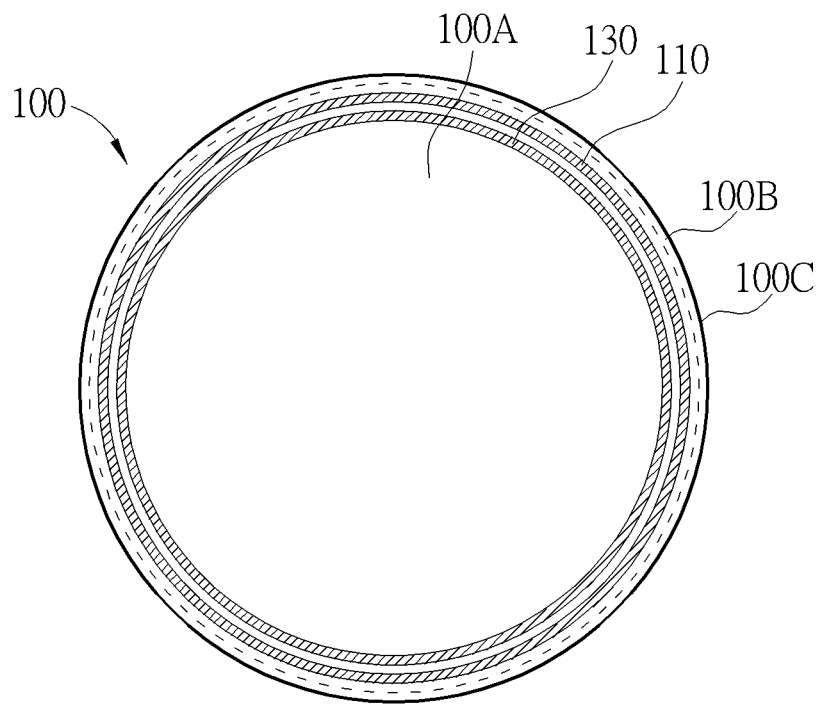
Figure 9:
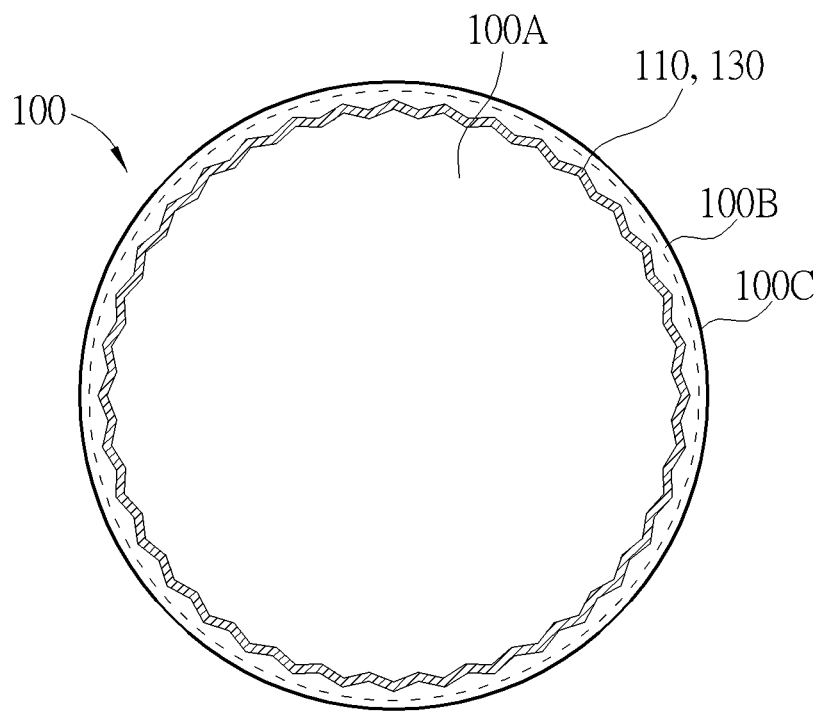

In the example shown in FIG. 6, a continuous ring-shaped amorphous layer 110 or trench 130 may be formed in the transition region (not shown) of the substrate 100 and along the complete outer edge of the planar region 100A as the transition region does. In the example shown in FIG. 7, a plurality of discontinuous amorphous layers 110 or trenches 130 may be formed in the transition region (not shown) of the substrate 100 and arranged along the outer edge of the planar region 100A along the transition region. In the example shown in FIG. 9, a continuous zigzag ring-shaped amorphous layer 110 or trench 130 may be formed in the transition region (not shown) of the substrate 100 and surrounds the complete outer edge of the planar region 100A as the transition region. It should be understood that the shapes and the numbers of the amorphous layers 110 or the trenches 130 provided by the present invention are only examples. In practice, the shapes and the numbers of the amorphous layers 110 or the trenches 130 may be adjusted according to different applications.

In the following description, embodiments of the present invention are provided to illustrate that an amorphous layer or a trench may be formed in a pre-determined region of a device region of the substrate in order to reduce the stress in the epitaxial layer on the device region of the substrate, and to prevent the crack or dislocation defect from extending or propagating.

Figure 10:
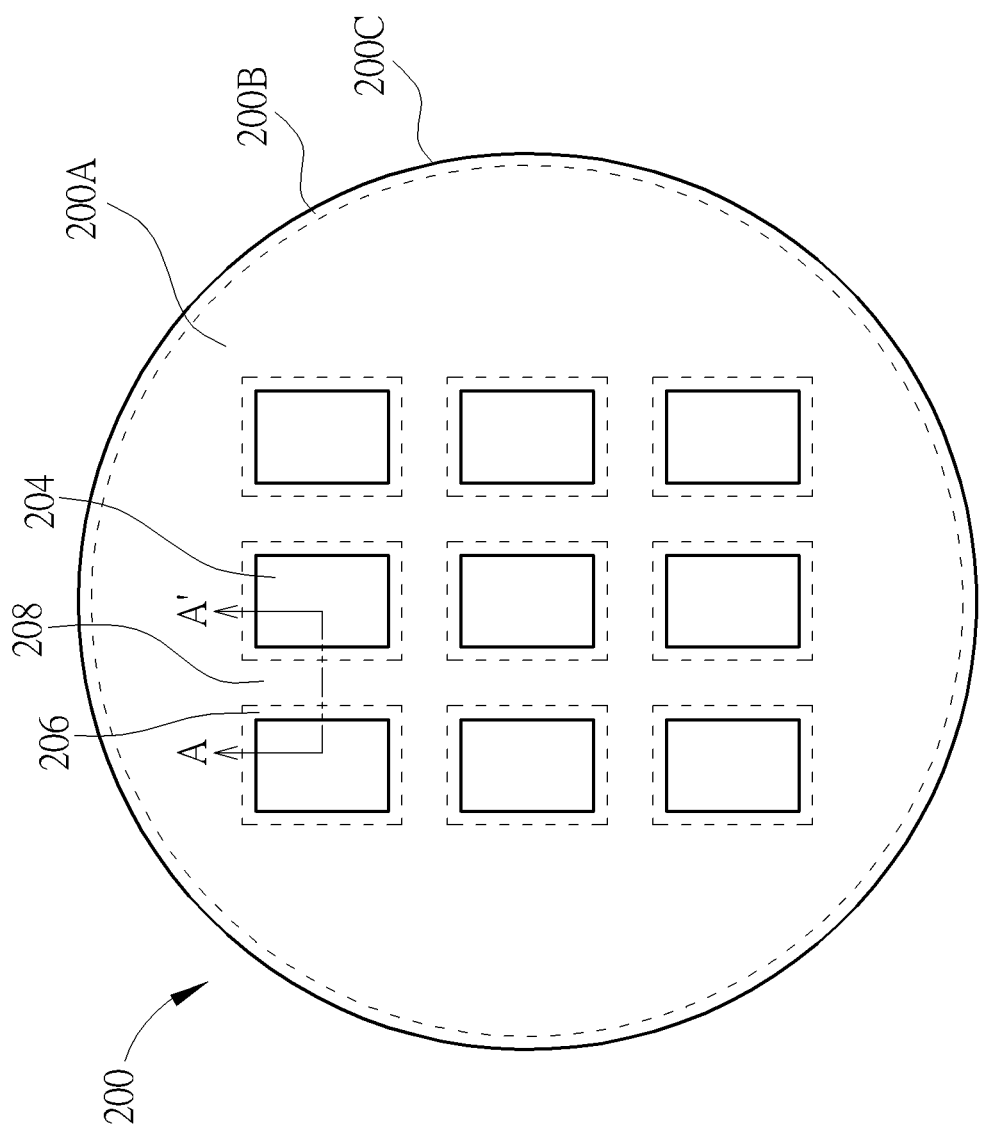
FIG. 10, FIG. 11 and FIG. 12 are schematic diagrams illustrating the steps of a method for forming a semiconductor structure according to one embodiment of the present invention.
Figure 11:
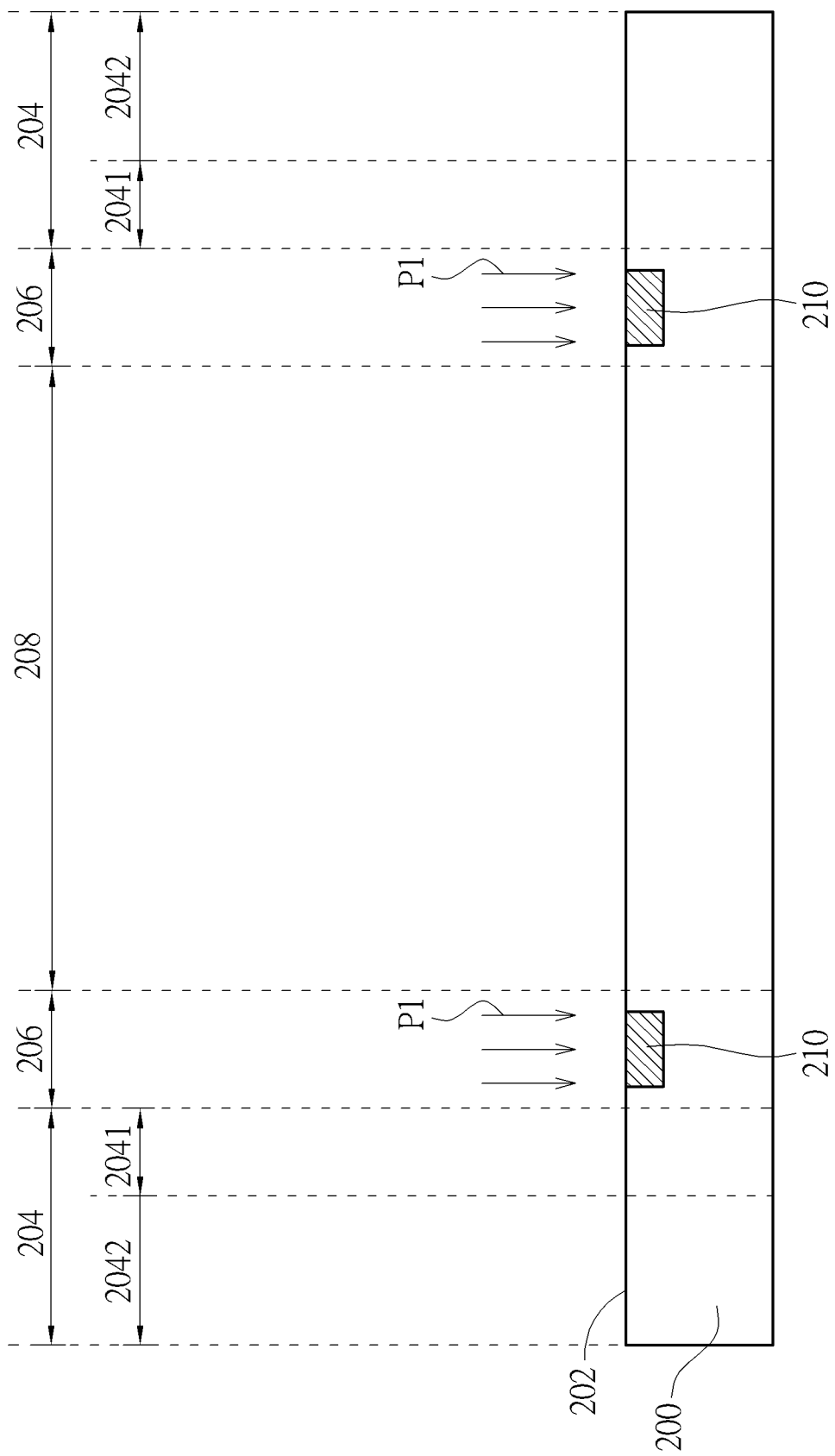
Figure 12:
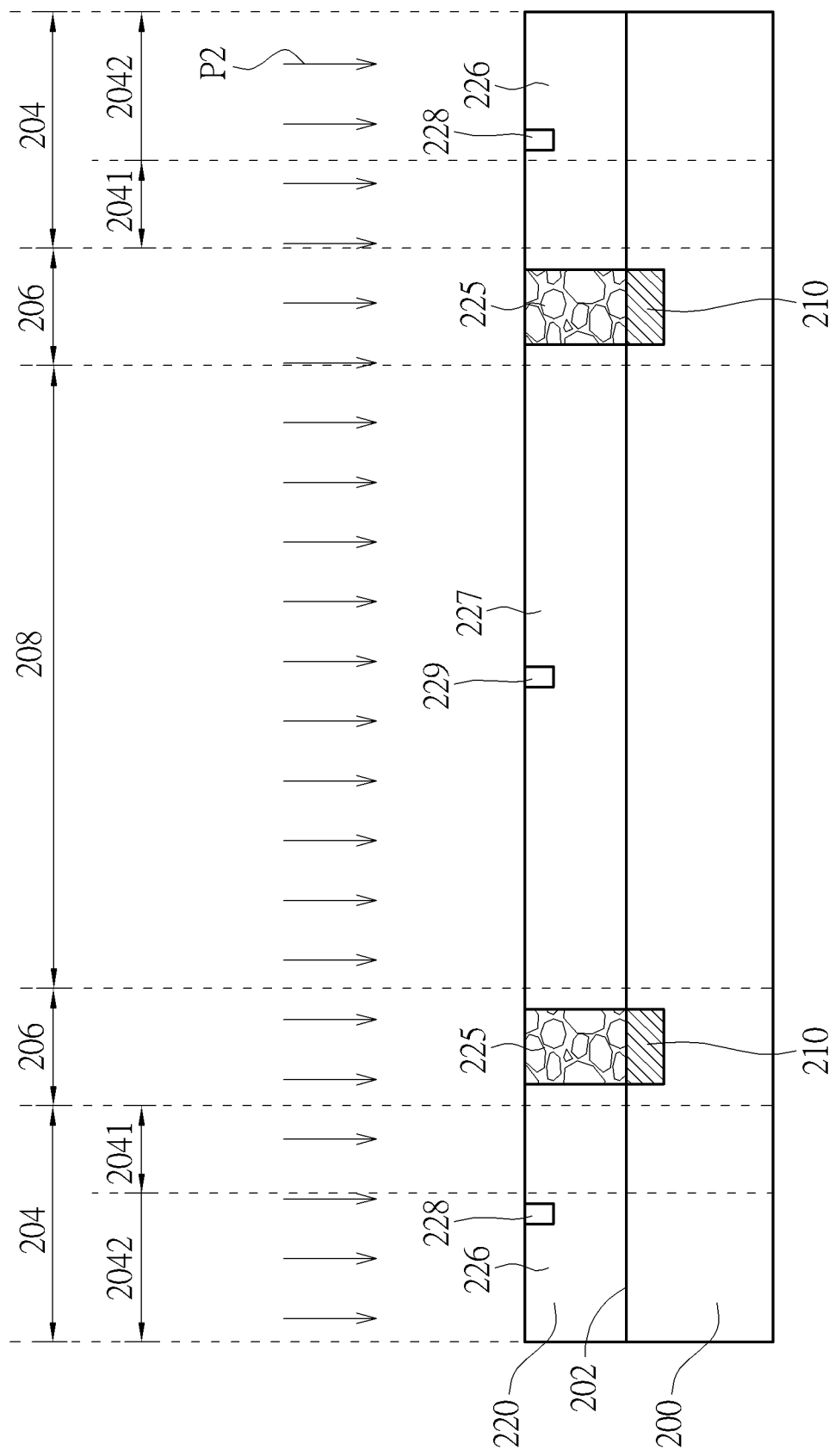

FIG. 10, FIG. 11 and FIG. 12 are schematic diagrams illustrating the steps of a method for forming a semiconductor structure according to one embodiment of the present invention. FIG. 10 shows a schematic top plan view of a substrate of the semiconductor structure. FIG. 11 and FIG. 12 are schematic enlarged cross-sectional views of a portion of the substrate along a line A-A' as shown FIG. 10.

Please refer to FIG. 10. A substrate 200 is provided. The substrate 200 may include a single crystal structure suitable for epitaxial growth. According to an embodiment, the material of the substrate 100 may include silicon (Si), silicon carbide (SiC), aluminum oxide (also called sapphire substrate), gallium arsenide (GaAs), gallium phosphide (GaP), nitrogen, gallium (GaN), or aluminum nitride (AlN), but is not limited thereto. According to an embodiment of the present invention, the substrate 200 may be a single crystal silicon wafer. The substrate 200 may include a planar region 200A, a wafer edge 200C, and a wafer edge region 200B located between the planar region 200A and the wafer edge 200C and surrounding the planar region 200A, as shown in FIG. 10.

The planar region 200A may be referred to as a device region that defines the region where the semiconductor devices such as transistors, bipolars, thyristors, light-emitting devices, capacitors, inductors or other types of semiconductor devices are formed. The planar region 200A may include a plurality of chip regions 204, a plurality of transition regions 206 respectively surrounding the chip regions 204, and a scribe line region 208 located between the transition regions 206 around the chip regions 204 and defining the region where the substrate 200 is cut to dice chip regions 204. In some embodiments, the transition regions 206 around the chip regions 204 may be completely cut out when cutting the substrate 200. In some embodiments, the transition regions 206 may be cutting buffer regions for the guard ring region 2041 (shown in FIG. 11), and portions of the transition regions 206 may be left around the chip regions 204 after cutting the substrate 200.

According to an embodiment of the present invention, as shown in FIG. 11, the chip regions 204 may respectively include a circuit region 2042 and a guard ring region 2041 surrounding the circuit region 2042. The transition regions 206 are between the guard ring regions 2041 of the chip regions 204 and the scribe line region 208. According to an embodiment of the present invention, the substrate 200 has a planar main surface 202, which is crystal plane of the substrate 200 with a uniform crystal orientation and covers the chip regions 204, the transition regions 206 and the scribe line region 208 of the substrate 200.

As shown in FIG. 11, an ion implantation process P1 may be performed on the main surface 202 of the substrate 200 to implant an amorphizing agent into pre-determined regions of the transition regions 206 in order to damage the crystal structure of the pre-determined regions of the substrate 100, such that an amorphous layers 210 near the main surface 202 and having an amorphous surface may be formed in each of the transition regions 206. According to an embodiment of the present invention, the amorphizing agent may be any substance capable to amorphize the crystal structure of the substrate 100. For example, the amorphizing agent may comprise at least one of argon (Ar), krypton (Kr), neon (Ne), nitrogen (N), arsenic (As), phosphorus (P), boron (B) and germanium (Ge), but is not limited thereto. The thickness of the amorphous layer 210 (or the depth of the bottom surface of the amorphous layer 210 in the substrate 200) may be controlled by the implanting angle and implanting energy of the ion implantation process P1. According to an embodiment of the present invention, the thickness of the amorphous layers 210 may be between 0.1 um and 1 um, but is not limited thereto.

Subsequently, as shown in FIG. 12, an epitaxial growth process P2 may be performed to form an epitaxial layer 220 on the substrate 200 and covering the chip regions 204, the transition regions 206, and the scribe line region 208 in a blanket manner. The epitaxial growth process P2 may include a hetero-epitaxial growth process such as molecule beam epitaxy (MEB) process, metal-organic chemical vapor deposition (MOCVD) process, or hydride vapor phase deposition (HVPE), but is not limited thereto. The epitaxial layer 220 may include semiconductor materials. For example, the epitaxial layer 220 may include layers of silicon (Si), germanium (Ge), boron (B), silicon carbide (SiC), III-V compound semiconductor materials such as GaAs, GaN, AlGaN, AlInN, InGaN, AlGaInN, doped GaN, AlN, or a combination thereof, but is not limited thereto. According to an embodiment of the present invention, the epitaxial layer 120 may have a multi-layered structure. For example, the epitaxial layer 120 may include at least a GaN layer and at least an AlGaN layer.

Please continue to refer to FIG. 12. To be more detailed, the epitaxial layer 220 may include fifth portions 225 respectively on the transition regions 206 of the substrate 200, sixth portions 226 respectively on the chip region 204 of the substrate 200, and a seventh portion 227 on the scribe line region 208 of the substrate 100. Because that the sixth portions 226 and the seventh portion 227 of the epitaxial layer 220 are grown from the crystal surface of the main surface 202, the sixth portions 226 and the seventh portion 227 may respectively have a single crystal structure. It is noteworthy that since the fifth portions 225 of the epitaxial layer 220 are grown from the amorphous surfaces of the amorphous layers 210, the fifth portions 225 may respectively have a poly-crystal structure.

After forming the epitaxial layer 220, as shown in FIG. 12, subsequent semiconductor manufacturing processes (not shown) such as deposition, lithography, etching, ion implantation, epitaxial growth, thermal growth, and/or other processes may be performed to form a plurality of semiconductor devices 228 in the sixth portions 226 of the epitaxial layer 220. The semiconductor devices 228 may include transistors, bipolars, thyristors, light-emitting devices, capacitors, inductors, or other semiconductor devices, but are not limited thereto. According to some embodiments of the present invention, test keys 229 may be formed in the seventh portion 227 of the epitaxial layer 220 on the scribe line region 208 when forming the semiconductor devices 228.

Figure 13:
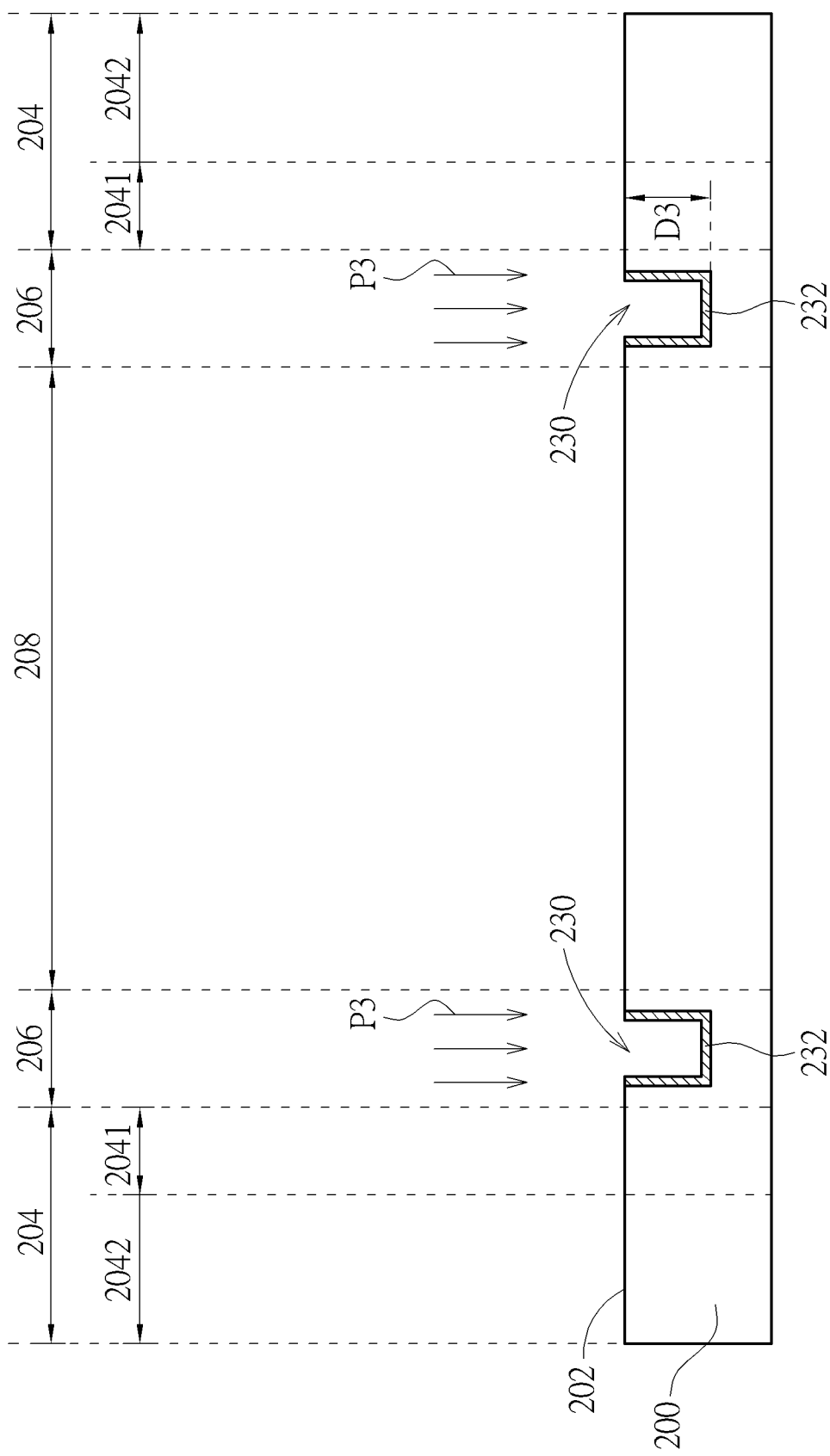
FIG. 13 and FIG. 14 are schematic enlarged cross-sectional views illustrating the steps of a method for forming a semiconductor structure according to another embodiment of the present invention.

One feature of the present invention is that, as shown in FIG. 11, FIG. 12, and FIG. 13, by forming the amorphous layers 210 in the transition regions 206 of the substrate 200, the fifth portions 225 of the epitaxial layer 220 epitaxially grown from the surfaces of the amorphous layer 210 may respectively have a poly-crystal structure and may release or absorb the stress in the epitaxial layer 220. Furthermore, the fifth portions 225 of the epitaxial layer 220 may also be used as barrier structures to prevent the dislocation defect from propagating into other chip regions 204. In this way, the quality of the semiconductor devices 228 may be guaranteed.

Figure 14:
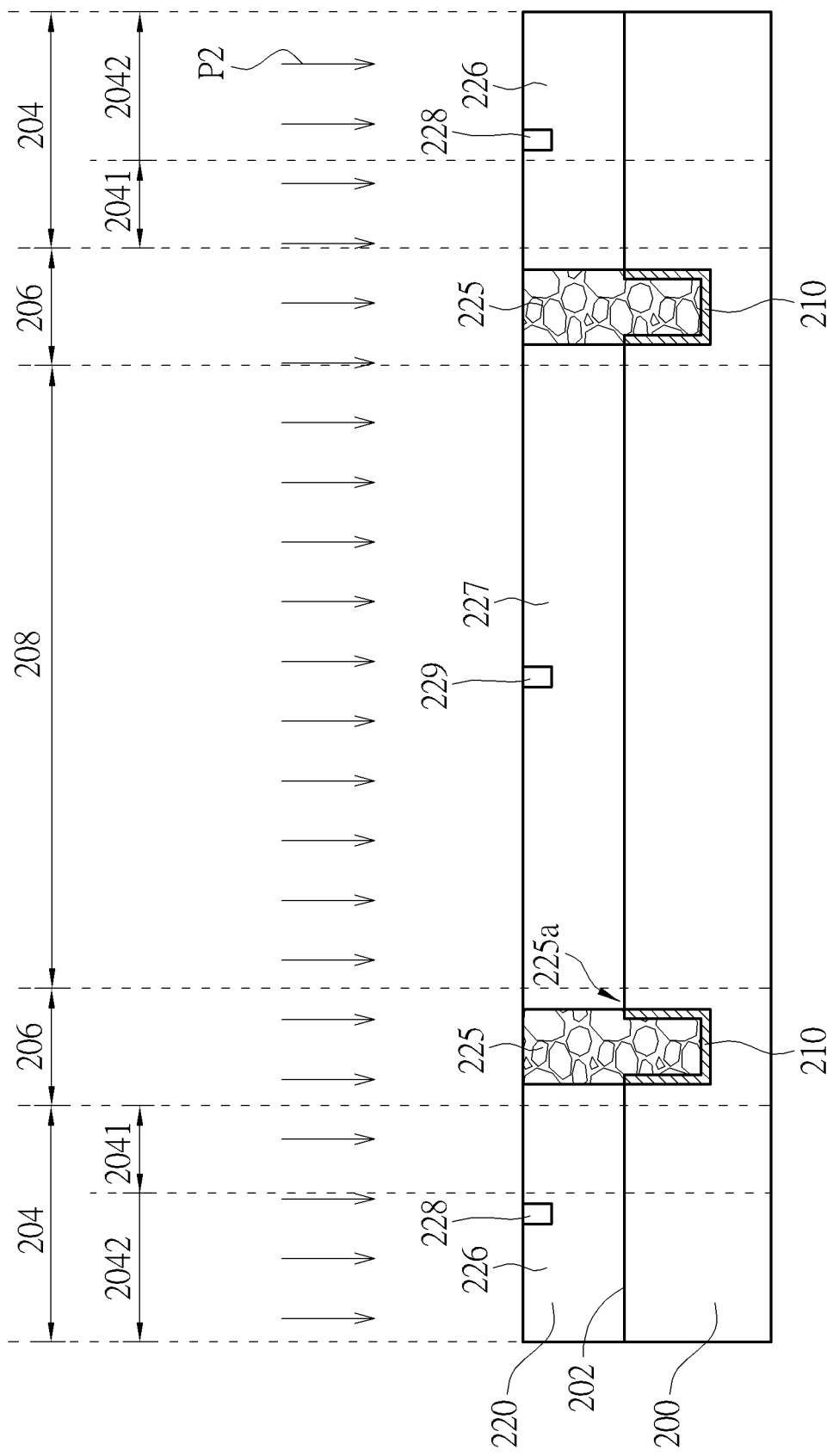

Please refer to FIG. 13 and FIG. 14, which are schematic cross-sectional views illustrating the steps of a method for forming a semiconductor structure according to another embodiment of the present invention. To simplify the description, identical components in the embodiment shown in FIG. 13 and FIG. 14 and the embodiment shown in FIG. 11 and FIG. 12 are marked with identical symbols. The embodiment shown in FIG. 13 and FIG. 14 is different from the embodiment shown in FIG. 11 and FIG. 12 in that, as shown in FIG. 13 and FIG. 14, an etching process P3 may be performed to form trenches 230 in the transition regions 206 of the substrate 200. After that, the epitaxial growth process P2 is performed to form the epitaxial layer 220 on the substrate 200 and covering the chip regions 204, the transition regions 206, and the scribe line region 208 and completely filling the trenches 230. According to an embodiment of the present invention, the etching process P3 may be a laser marking process, and the trenches 230 may be laser mark trenches. In other embodiments, the etching process P3 may be a dry etching process such as plasma etching process or ion beam etching process or a wet etching process, and the trenches 230 may be etched trenches, but is not limited thereto. The trenches 230 may respectively have a depth D3 in the substrate, and the depth D3 may be adjusted according to design needs. According to an embodiment of the present invention, the depth D3 may be at least 1 um.

According to an embodiment of the present invention, the lattice structure of the substrate 200 exposed from the sidewalls and bottom surfaces of the trenches 230 may be destroyed by the etching process P3, such that an amorphous layer 232 may be formed along the sidewall and bottom surface of each of the trench 130. Therefore, the fifth portions 225 of the epitaxial layer 220 that are grown on the amorphous layers 232 and completely fill the trenches 230 may respectively have a poly-crystal structure. The poly-crystal structures of the fifth portions 225 may help to release the stress in the epitaxial layer 220 and also prevent the propagations of the dislocation defects. According to an embodiment of the present invention, the fifth portions 225 of the epitaxial layer 220 may respectively have a slightly extended portion 225a that extends laterally to cover the top surface of the amorphous layer 232 near the opening of the trenches 230.

Figure 15:
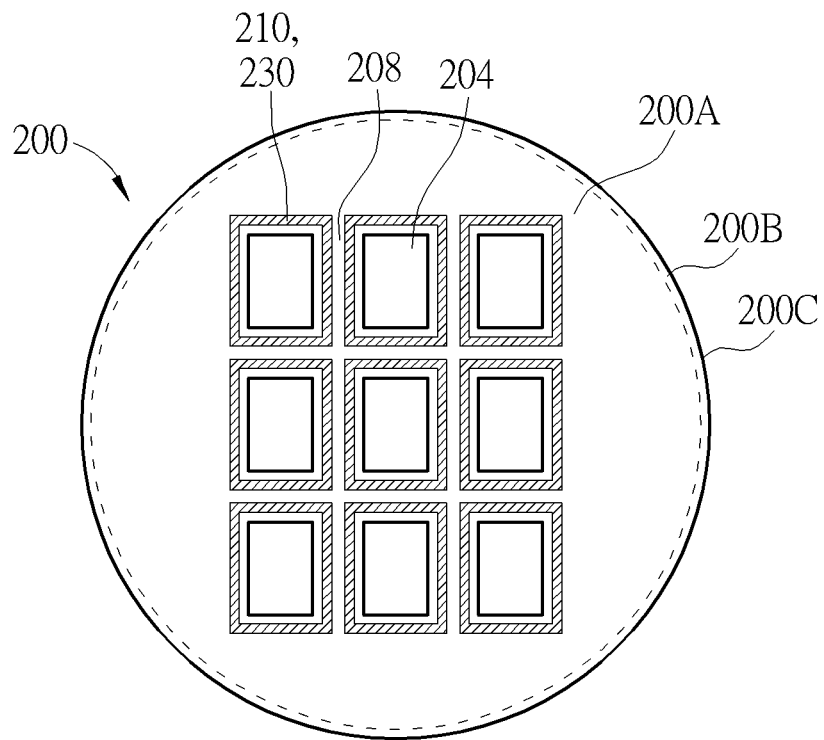
FIG. 15 and FIG. 16 are schematic top plan views of the semiconductor structures according to some embodiments of the present invention.
Figure 16:
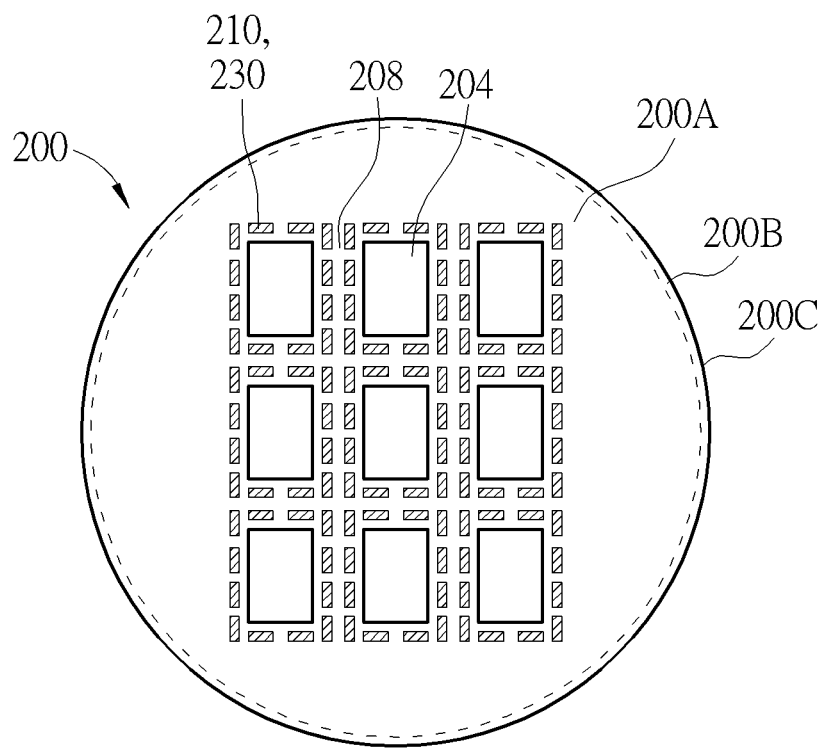

FIG. 15 and FIG. 16 are schematic top plan views showing some exemplary implementations of the amorphous layers 210 of the embodiment shown in FIG. 11 and FIG. 12 or the trenches 230 of the embodiment shown in FIG. 13 and FIG. 14.

In the example shown in FIG. 15, continuous ring-shaped amorphous layers 210 or trenches 230 may be formed in the transition regions (not shown) of the substrate 200 and completely surrounding the chip regions 204. In the example shown in FIG. 16, a plurality of discontinuous amorphous layers 210 or trenches 230 may be formed in the transition regions (not shown) of the substrate 200 and arranged along the outer edge of the chip regions 204. It should be understood that the shapes and numbers of the amorphous layers 210 or the trenches 230 may be adjusted according to the shapes of the chip regions 204 or the scribe line region 208. For example, the amorphous layers 210 or the trenches 230 may be circular continuous ring-shaped, circular discontinuous ring-shaped, non-circular continuous ring-shaped, non-circular discontinuous ring-shaped, continuous polygonal ring-shaped, or non-continuous polygonal ring-shaped, but are not limited thereto. The embodiments illustrated above are only examples, and shall not be interpreted as limitations to the present invention.

In summary, the semiconductor structure provided by the present invention includes an amorphous layer or a trench formed in a pre-determined region of the substrate, which allows a portion of the epitaxial layer grown on the amorphous layer or the trench to have a poly-crystal structure for releasing or absorbing the stress in the epitaxial layer caused by lattice mismatch or thermal expansion mismatch between the substrate and the epitaxial layer. Furthermore, the poly-crystal portion of the epitaxial layer may also serve as a barrier structure to prevent the cracks or dislocation defects from extending or propagating. In this way, the semiconductor structure provided by the present invention may have increased process stability, and an increased product yield may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a single crystal silicon wafer comprising a device region, a peripheral region surrounding the device region, a bevel region surrounding the peripheral region, and a transition region between the peripheral region and the device region;
   an epitaxial layer directly on a surface of the single crystal silicon wafer, comprising:
      a first portion on the transition region;
      a second portion on the device region;
      a third portion on the peripheral region; and
      a fourth portion on the bevel region, wherein the first portion has a poly-crystal structure, and the second portion and the third portion respectively have a single crystal structure; and
   an amorphous silicon layer in the single crystal silicon wafer and directly under the first portion of the epitaxial layer, wherein a bottom surface and a side surface of the amorphous layer directly contact the single crystal silicon wafer.

2. The semiconductor structure according to claim 1, wherein the amorphous layer is an amorphous region of the single crystal silicon wafer.

3. The semiconductor structure according to claim 1, wherein the amorphous layer continuously surrounds the device region.

4. The semiconductor structure according to claim 1, wherein the transition region of the single crystal silicon wafer comprises a plurality of the amorphous layers, the plurality of the amorphous layers are arranged non-continuously surrounding the device region.

5. The semiconductor structure according to claim 1, wherein the transition region of the single crystal silicon wafer comprises a trench and the first portion of the epitaxial layer completely fills the trench.

6. The semiconductor structure according to claim 5, wherein the trench continuously surrounds the device region.

7. The semiconductor structure according to claim 5, wherein the transition region of the single crystal silicon wafer comprises a plurality of the trenches, the plurality of the trenches are arranged non-continuously surrounding the device region.

8. The semiconductor structure according to claim 1, wherein the single crystal silicon wafer comprises single crystal silicon, the epitaxial layer comprises an III-V semiconductor material.

9. The semiconductor structure according to claim 8, wherein the epitaxial layer comprises at least a GaN layer and at least an AlGaN layer.

10. The semiconductor structure according to claim 1, further comprising a plurality of semiconductor devices formed in the second portion of the epitaxial layer.

11. The semiconductor structure according to claim 1, wherein a distance from the transition region to an edge of the single crystal silicon wafer is between 7% and 10% of a radius of the single crystal silicon wafer.

12. The semiconductor structure according to claim 1, wherein the fourth portion has a single crystal structure or a poly-crystal structure.

13. The semiconductor structure according to claim 1, wherein the bevel region is between the peripheral region and an edge of the single crystal silicon wafer, and the fourth portion of the epitaxial layer covers the edge of the single crystal silicon wafer.

* * * * *